United States Patent
Imai et al.

(10) Patent No.: US 7,536,762 B2
(45) Date of Patent: May 26, 2009

(54) METHOD OF MANUFACTURING AN INK-JET ASSEMBLY

(75) Inventors: Koji Imai, Inyuama (JP); Yuji Shinkai, Handa (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 391 days.

(21) Appl. No.: 11/341,639

(22) Filed: Jan. 30, 2006

(65) Prior Publication Data

US 2006/0187649 A1    Aug. 24, 2006

(30) Foreign Application Priority Data

Jan. 31, 2005    (JP)    ............................. 2005-022841

(51) Int. Cl.
*H05K 3/34*    (2006.01)
*B21D 53/76*    (2006.01)

(52) U.S. Cl. .................. 29/25.35; 29/890.1; 29/840; 29/843; 29/860; 228/175; 228/180.1; 347/50; 347/70

(58) Field of Classification Search ............... 29/25.35, 29/890.1, 840, 843, 860; 228/175, 179.1, 228/180.1; 347/50, 68, 70

See application file for complete search history.

(56) References Cited

U.S. PATENT DOCUMENTS

| 4,515,304 A | * | 5/1985 | Berger ................. 228/180.1 X |
| 4,811,170 A | * | 3/1989 | Pammer ................... 29/840 X |
| 6,397,465 B1 | * | 6/2002 | Akhavain et al. .......... 29/890.1 |
| 2003/0063449 A1 | | 4/2003 | Suzuki et al. |

FOREIGN PATENT DOCUMENTS

| JP | 05013944 A | * | 1/1993 | ............... 29/840 X |
| JP | 1995066362 A | | 3/1995 | |
| JP | 2003159795 A | | 6/2003 | |

* cited by examiner

*Primary Examiner*—A. Dexter Tugbang
(74) *Attorney, Agent, or Firm*—Baker Botts L.L.P.

(57) ABSTRACT

A method for manufacturing a board assembly comprises the steps of: tin-plating a first terminal and a copper-made second terminal that are formed on a circuit board; mounting an electronic component on the circuit board by means of gold-tin eutectic bonding between a gold electrode of the electronic component and the tin-plated first terminal; forming a copper-tin alloy on a surface of the second terminal by heating the circuit board after the mounting step; and bonding the second terminal having the copper-tin alloy formed on its surface to a terminal of another board by means of a thermo-setting conductive adhesive.

4 Claims, 12 Drawing Sheets

METHOD OF MANUFACTURING AN INK-JET ASSEMBLY

BACKGROUND OF THE INVENTION

1. Field of the Invention

The present invention relates to a board assembly that includes a circuit board, an electronic component mounted on the circuit board, and another board bonded to the circuit board, to an ink-jet head that includes a circuit board, a driver IC mounted on the circuit board, and a piezoelectric actuator bonded to the circuit board, and also to a method for manufacturing them.

2. Description of Related Art

Some ink-jet heads include a passage unit in which many pressure chambers are formed, and a piezoelectric actuator that has active portions corresponding to the respective pressure chambers and is bonded to the passage unit. Surface electrodes corresponding to the respective active portions are provided on an upper face of the piezoelectric actuator. Terminals of a flexible printed circuit (FPC) for applying voltage to the piezoelectric actuator are bonded to the respective surface electrodes. The FPC is mounted with an IC chip (see Japanese Patent Unexamined Publication No. 2003-159795).

In order to mount an electronic component such as the IC chip on a circuit board, for example, terminals of the electronic component are gold-plated while wiring patterns on the circuit board are tin-plated, and then the gold-plated layers formed on the respective terminals of the electronic component and the tin-plated layers formed on the wiring patterns of the circuit board are brought into contact and subjected to a heat treatment, so that the gold-plated layers and the tin-plated layers are bonded by means of gold-tin eutectic bonding (see Japanese Patent Unexamined Publication No. 7-66362). Therefore, in order to manufacture the above-described ink-jet head, gold-plated terminals of the IC chip and tin-plated terminals of the FPC are brought into contact, and the gold-plated layers and the tin-plated layers are bonded by means of gold-tin eutectic bonding, so that the IC chip is mounted on the FPC.

SUMMARY OF THE INVENTION

The FPC has terminals to be bonded to the IC chip and terminals to be bonded to the piezoelectric actuator. Accordingly, when the terminals to be bonded to the IC chip are tin-plated, the terminals to be bonded to the piezoelectric actuator are also tin-plated. As a result, when the terminals of the FPC to be bonded to the piezoelectric actuator and the surface electrodes of the piezoelectric actuator are bonded with a conductive adhesive, tin ions existing in the tin that is plated on the terminals of the FPC are scattered over the conductive adhesive, thus forming voids within the tin plate. This causes an increased electrical resistance between the FPC and the piezoelectric actuator.

Here, one possible measure is to cover the terminals of the FPC which will be bonded to the piezoelectric actuator, so that the terminals may not be tin-plated. In this case, however, complicated procedures including a step of covering the terminals and a step of removing the covering are required, and thus a manufacturing cost increases.

An object of the present invention is to provide a method for manufacturing a board assembly that includes a circuit board, an electronic component mounted on the circuit board, and another board bonded to the circuit board, by which the board assembly having a decreased electrical resistance between boards can be manufactured relatively easily at a lowered cost.

Another object of the present invention is to provide a method for manufacturing an ink-jet head that includes a circuit board, a driver IC mounted on the circuit board, and a piezoelectric actuator bonded to the circuit board, by which the ink-jet head having a decreased electrical resistance between the circuit board and the piezoelectric actuator can be manufactured relatively easily at a lowered cost.

Still another object of the present invention is to provide a board assembly including a circuit board, an electronic component mounted on the circuit board, and another board bonded to the circuit board, which has a decreased electrical resistance between the boards and can be manufactured relatively easily at a lowered cost.

Still another object of the present invention is to provide an ink-jet head including a circuit board, a driver IC mounted on the circuit board, and a piezoelectric actuator bonded to the circuit board, which has a decreased electrical resistance between the circuit board and the piezoelectric actuator and can be manufactured relatively easily at a lowered cost.

According to a first aspect of the present invention, there is provided a method for manufacturing a board assembly comprising the steps of: tin-plating a first terminal and a copper-made second terminal that are formed on a circuit board; mounting an electronic component on the circuit board by means of gold-tin eutectic bonding between a gold electrode of the electronic component and the tin-plated first terminal; forming a copper-tin alloy on a surface of the second terminal by heating the circuit board after the mounting step; and bonding the second terminal having the copper-tin alloy formed on its surface to a terminal of another board by means of a thermosetting conductive adhesive.

According to a second aspect of the present invention, there is provided a method for manufacturing an ink-jet head. The ink-jet head includes a passage unit in which nozzles for ejecting ink and pressure chambers respectively communicating with the nozzles are formed, a piezoelectric actuator that changes a volume of any of the pressure chambers, a circuit board that is fixed to the piezoelectric actuator, and a driver IC that supplies a drive signal to the piezoelectric actuator. The method comprises the steps of: tin-plating a first terminal and a copper-made second terminal that are formed on the circuit board; mounting the driver IC on the circuit board by means of gold-tin eutectic bonding between a gold electrode of the driver IC and the tin-plated first terminal; forming a copper-tin alloy on a surface of the second terminal by heating the circuit board after the mounting step; and bonding the second terminal having the copper-tin alloy formed on its surface to a terminal of the piezoelectric actuator by means of a thermosetting conductive adhesive.

According to a third aspect of the present invention, there is provided a board assembly comprising a circuit board that has a first terminal and a copper-made second terminal, an electronic component that has a gold electrode for being bonded to the first terminal and is mounted on the circuit board, and another board that has a terminal for being bonded to the second terminal. The first terminal, whose surface is tin-plated, is bonded to the gold electrode by means of gold-tin eutectic bonding. The second terminal, whose surface is formed with a copper-tin alloy, is bonded to the terminal of the another board by means of a thermosetting conductive adhesive.

According to a fourth aspect of the present invention, there is provided an inkjet head including a passage unit in which nozzles for ejecting ink and pressure chambers respectively communicating with the nozzles are formed, a piezoelectric actuator that changes a volume of any of the pressure chambers, a circuit board that is fixed to the piezoelectric actuator, and a driver IC that supplies a drive signal to the piezoelectric actuator. The circuit board has a first terminal and a copper-made second terminal. The driver IC has a gold electrode for being bonded to the first terminal. The piezoelectric actuator has a terminal for being bonded to the second terminal. The first terminal, whose surface is tin-plated, is bonded to the gold electrode by means of gold-tin eutectic bonding. The second terminal, whose surface is formed with a copper-tin alloy, is bonded to the terminal of the piezoelectric actuator by means of a thermosetting conductive adhesive.

In the first to fourth aspects, heating of the circuit board causes copper and tin to be scattered in the surface of the copper-made second terminal, to form a copper-tin alloy layer on the surface of the second terminal. This can relieve a problem that tin ions existing in the tin-plated layer formed on the surface of the second terminal are scattered over the conductive adhesive to thereby increase the electrical resistance between the second terminal of the circuit board and the terminal of the another board or the piezoelectric actuator, though this problem may occur if the tin-plated layer formed on the surface of the second terminal is bonded through a thermosetting conductive adhesive to the terminal of the another board or the piezoelectric actuator. That is, the electrical resistance between the circuit board and the another board or the piezoelectric actuator becomes lower.

In the plating step, there is no need to cover the second terminal against the tin plate. Thus, complicated procedures including a step of covering the second terminal and a step of removing the covering are not required, to prevent increase of a manufacturing cost.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

In the following, a preferred embodiment of the present invention will be described with reference to the accompanying drawings.

Figure 1:
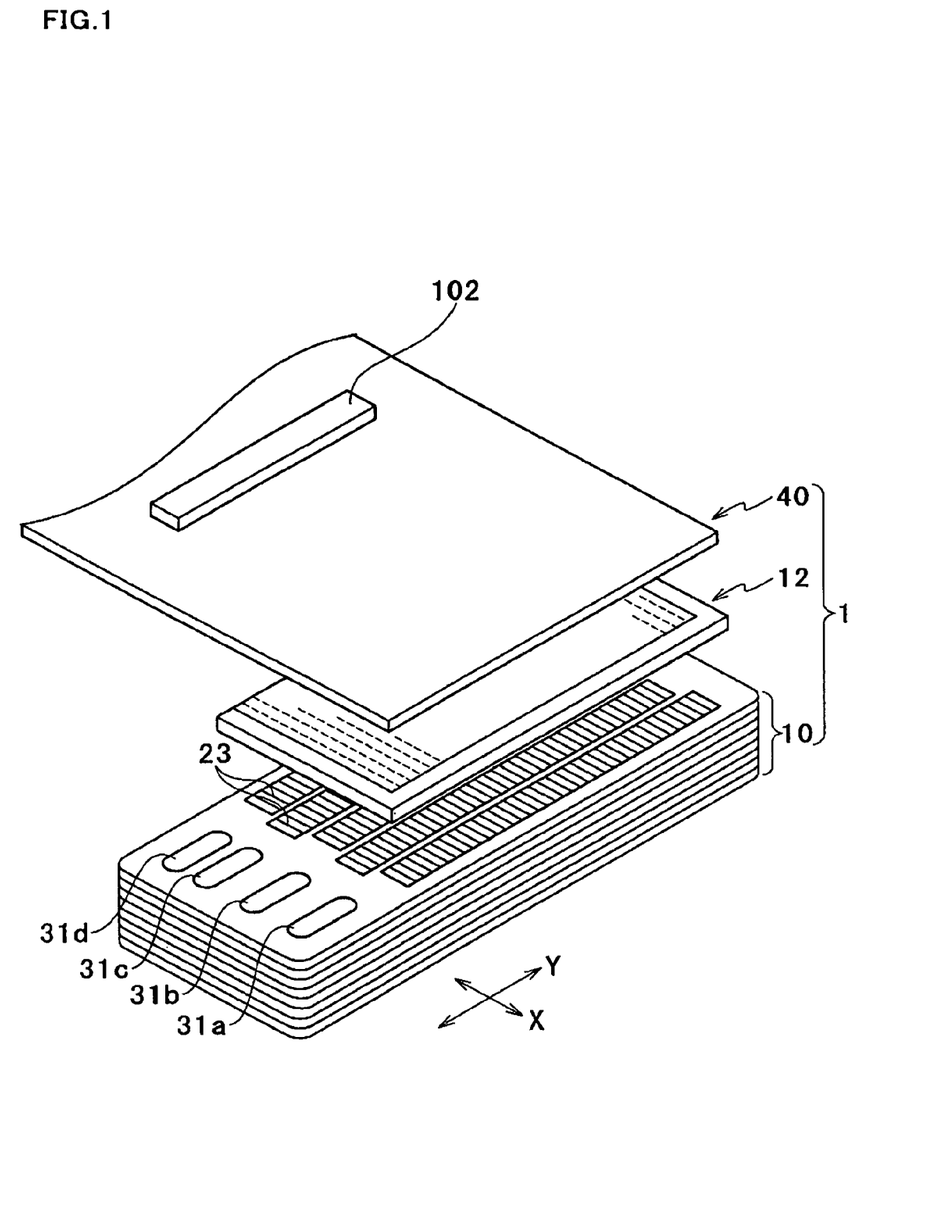
FIG. 1 is an exploded perspective view of an ink-jet head according to an embodiment of the present invention.

As shown in FIG. 1, an ink-jet head 1 of this embodiment includes a passage unit 10, a piezoelectric actuator 12, and an FPC 40. The head 1 is of so-called serial type, and mounted on a carriage (not illustrated) that reciprocates along a main scanning direction indicated by arrow X (hereinafter referred to as X direction) which is perpendicular to a paper conveyance direction or sub scanning direction indicated by arrow Y (hereinafter referred to as Y direction). The carriage accommodates removable ink cartridges respectively containing cyan ink, magenta ink, yellow ink, and black ink, which are fed to the head 1.

Many nozzles 11a (see FIG. 2), which open in a lower face of the passage unit, respectively communicates with the pressure chambers 23 formed in an upper face of the passage unit 10. In order to eject ink from a nozzle 11a, the piezoelectric actuator 12 generates a pressure wave in a corresponding pressure chamber 23. The piezoelectric actuator 12 is of plate type, and bonded to the upper face of the passage unit 10 with an adhesive. The FPC 40 supplies to the piezoelectric actuator 12 a drive signal for driving the piezoelectric actuator 12 and a common signal which is a constant voltage signal. The FPC 40 is bonded to an upper face of the piezoelectric actuator 12.

Here, the passage unit 10 will be detailed with reference to FIGS. 2 and 3.

Figure 2:
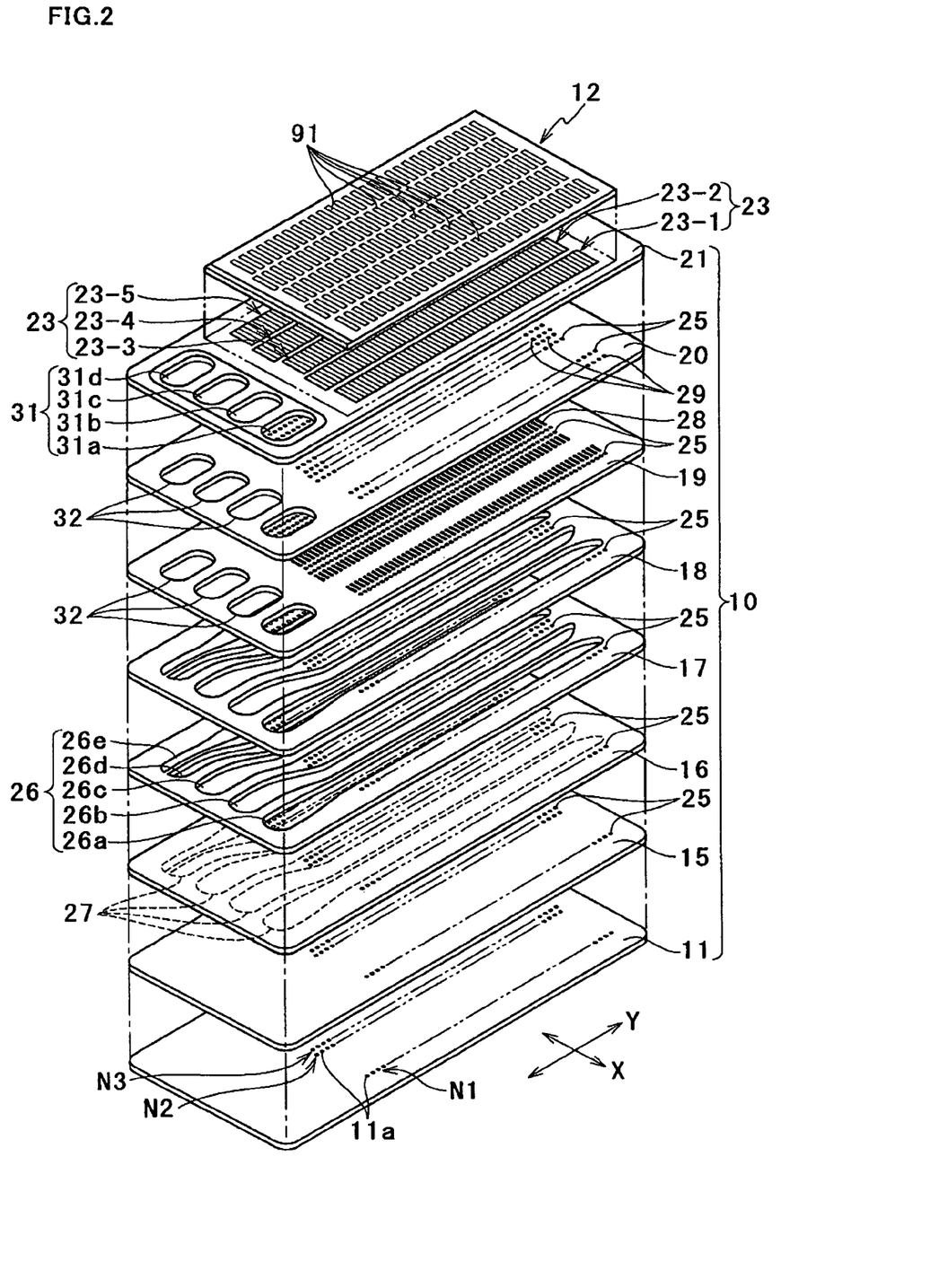
FIG. 2 is an exploded perspective view of a passage unit included in the inkjet head shown in FIG. 1.

As shown in FIG. 2, the passage unit 10 has a total of eight flat plates, that is, from the lowermost one, a nozzle plate 11, a cover plate 15, a damper plate 16, two manifold plates 17, 18, two spacer plates 19, 20 and a base plate 21, which are put in layers and bonded with adhesive. The nozzle plate 11 is made of a synthetic resin, and the other plates 15 to 21 are made of 42% nickel alloy steel plate. Each of the plates 11, 15 to 21 has a thickness of approximately 50 to 150 μm.

Many nozzles 11a each having a small diameter of 25 μm are formed through the nozzle plate 11. The nozzles 11a are arranged in a zigzag pattern along the Y direction, and five nozzle rows are arranged at intervals with respect to the X direction. Among the five nozzle rows extending along the Y direction, a first row N1, a second row N2, and a third row N3 are shown in FIG. 2, but fourth and fifth rows are not shown. Each of the first to fifth nozzle rows has a length of one inch and includes seventy-five nozzles 11a. Thus, the nozzles 11a are arranged at a density of 75 dpi (dot per inch). Nozzles 11a included in the first row N1 eject cyan ink, nozzles 11a included in the second row N2 eject yellow ink, nozzles 11a included in the third row N3 eject magenta ink, and nozzles 11a included in the fourth and fifth rows (not shown in FIG. 2) eject black ink.

Pressure chambers 23 that respectively correspond to the nozzles 11a are formed through the base plate 21. The pressure chambers 23, as well as the nozzles 11a, are arranged in a zigzag pattern along the Y direction, and five pressure chamber rows are arranged at intervals with respect to the X direction. In FIG. 2, the five pressure chamber rows extending along the Y direction are denoted by reference numerals 23-1, 23-2, 23-3, 23-4, and 23-5, respectively. As shown in FIG. 3, the pressure chambers 23 included in each row are disposed with partitions 24 interposed therebetween along the Y direction. The pressure chambers 23 are arranged in a so-called zigzag pattern so that the pressure chambers 23 included in one row are shifted from the pressure chambers 23 included in another neighboring row by a half pitch in the Y direction. Each pressure chamber 23 has a shape elongated along the X direction. One longitudinal end of each pressure chamber 23 communicates with a communication hole 29 formed through the upper spacer plate 20, and the other longitudinal end of each pressure chamber 23 communicates with a nozzle 11a via communication paths 25 formed through the cover plate 15, the damper plate 16, the manifold plates 17, 18, and the spacer plates 19, 20.

Four ink supply ports 31 are also formed through the base plate 21 to be located near one end of the base plate 21 in the Y direction. In FIG. 2, the four ink supply ports 31 formed at appropriate intervals in the X direction are denoted by reference numerals 31a, 31b, 31c, and 31d, respectively. Ink supply paths 32 respectively communicating with the ink supply ports 31 are formed through the spacer plates 19 and 20.

Ink passages, which respectively extend below the pressure chamber rows in the Y direction, are formed through the manifold plates 17 and 18 so that five common ink chambers 26 appear when the plates 17 and 18 are put in layers. One end of each common ink chamber 26 communicates with a corresponding ink supply path 32 and a corresponding ink supply port 31. In FIG. 2, the five common ink chambers are denoted by reference numerals 26a, 26b, 26c, 26d, and 26e, respectively. Via the ink supply paths 32 formed through the spacer plates 19 and 20, the common ink chamber 26a, 26b, and 26c communicate with the ink supply ports 31a, 31b, and 31c, respectively, and both of the common ink chambers 26d and 26e communicate with the ink supply port 31d.

A lower face of the damper plate 16 is recessed to form damper chambers 27 each having a shape to coincide with the common ink chamber 26 in a plan view, so that sealed-up damper chambers 27 appear when the damper plate 16 and the cover plate 15 are put in layers. Accordingly, when a pressure wave incurs in the pressure chamber 23, a retrograde component of the pressure wave which travels toward the common ink chamber 26 can be absorbed by vibration of a thin wall above the damper chambers 27, which thereby prevents so-called crosstalk.

Figure 3:
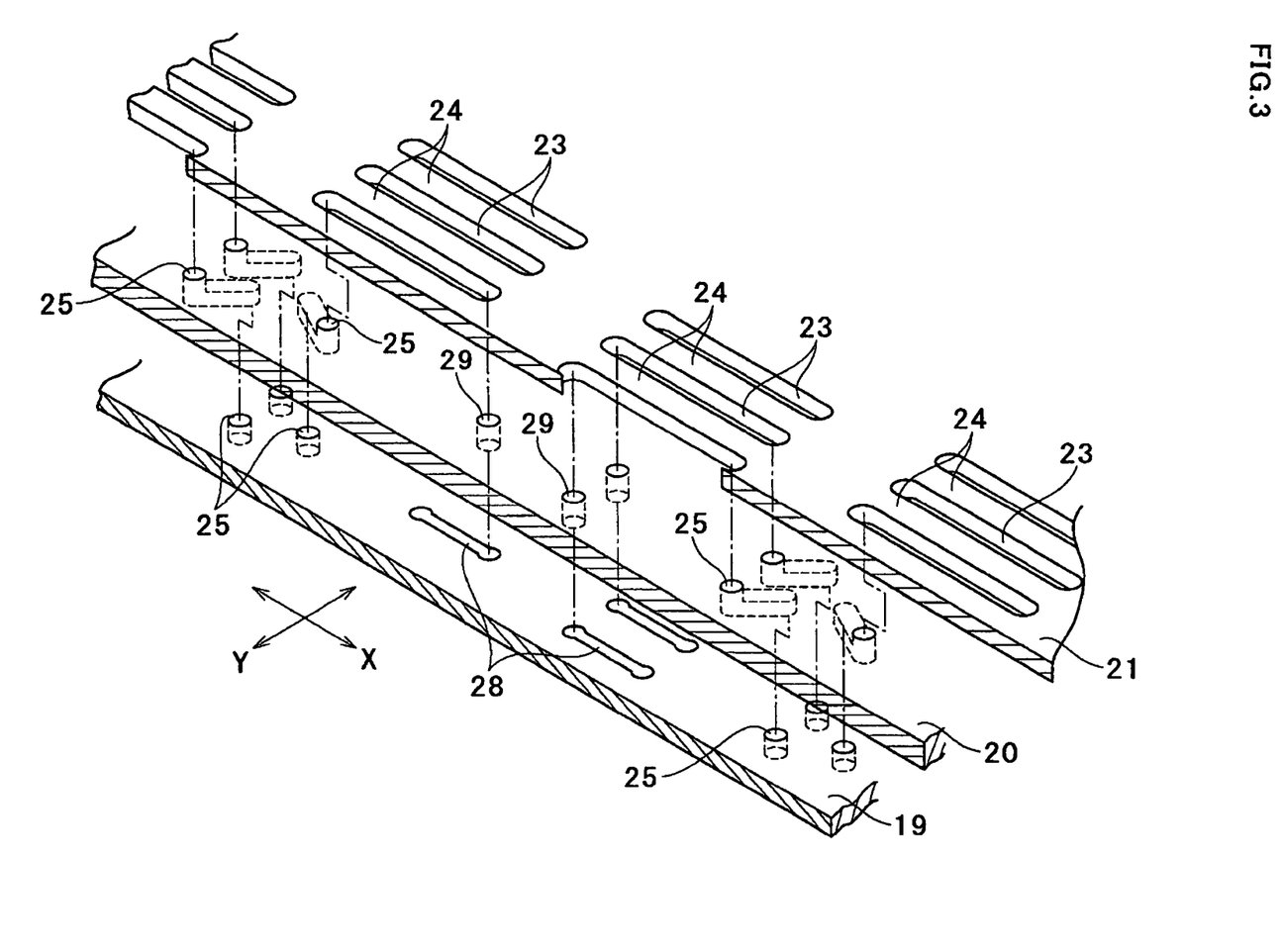
FIG. 3 is a partial enlarged view of FIG. 2.

As shown in FIG. 3, an upper face of the lower spacer plate 19 is recessed to form throttles 28 each having a shape elongated in the X direction. The throttles 28 correspond to the respective pressure chambers 23. Each throttle 28 has its one end communicating with a corresponding common ink chamber 26 and the other end communicating with a corresponding pressure chamber 23 via a communication hole 29 that is formed through the upper spacer plate 20.

Ink supplied to each ink supply port 31 flows into a corresponding common ink chamber 26, passes through throttles 28 and communication holes 29, and distributed to the pressure chambers 23. Then, the ink goes from the pressure chambers 23 through communication paths 25 to nozzles 11a corresponding to these pressure chambers 23. Cyan ink, yellow ink, magenta ink, and black ink are respectively supplied to the ink supply ports 31a, 31b, 31c, and 31d.

Next, the piezoelectric actuator 12 will be detailed with reference to FIGS. 4, 5, 6, 7A, and 7B.

The piezoelectric actuator 12 has active portions which are portions of the piezoelectric sheets 33 and 34 sandwiched between the individual electrodes 36 and the common electrode 37. By applying a voltage to between a certain individual electrode 36 and the common electrode 37, an active portion of the piezoelectric sheet corresponding to this individual electrode 36 is distorted in the thickness direction due to the longitudinal piezoelectric effect. A common signal is applied to the common electrode 37 via the FPC 40, and a drive signal is applied to the individual electrode 36. Change in voltage of the drive signal causes a voltage difference between the individual electrode 36 and the common electrode 37.

The active portions, the number of which is the same as that of the pressure chambers 23, are formed so as to coincide with the pressure chambers 23 in a plan view, respectively. That is, like the pressure chambers 23, the active portions each having a shape elongated along the X direction are arrayed in five rows along the extending direction of the pressure chamber rows, i.e., along the Y direction. The active portions included in each row are shifted from the active portions included in another neighboring row by a half pitch in the Y direction, and are arranged in a so-called zigzag pattern.

Figure 4:
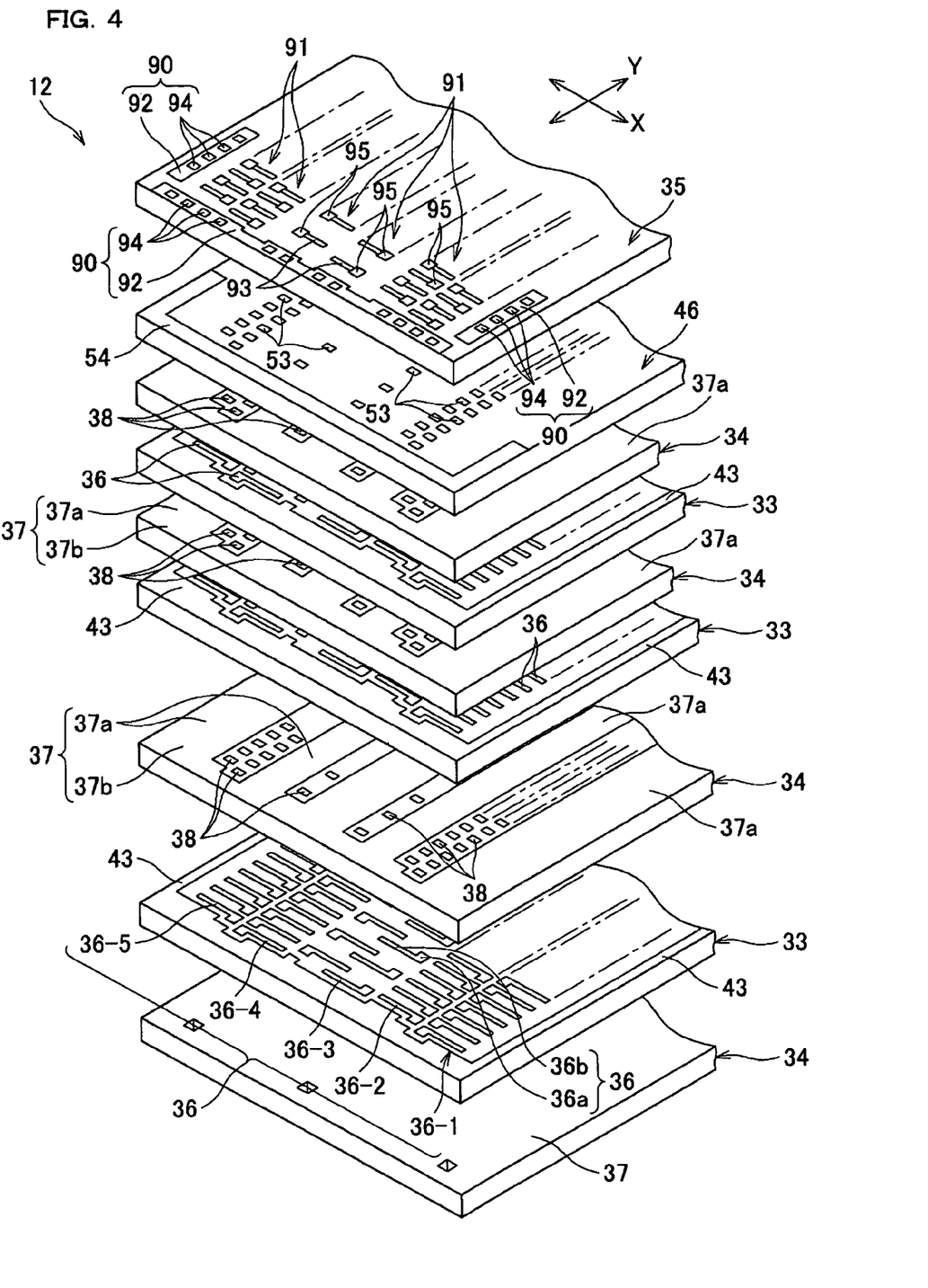
FIG. 4 is a partial exploded perspective view of a piezoelectric actuator included in the ink-jet head shown in FIG. 1.
Figure 5:
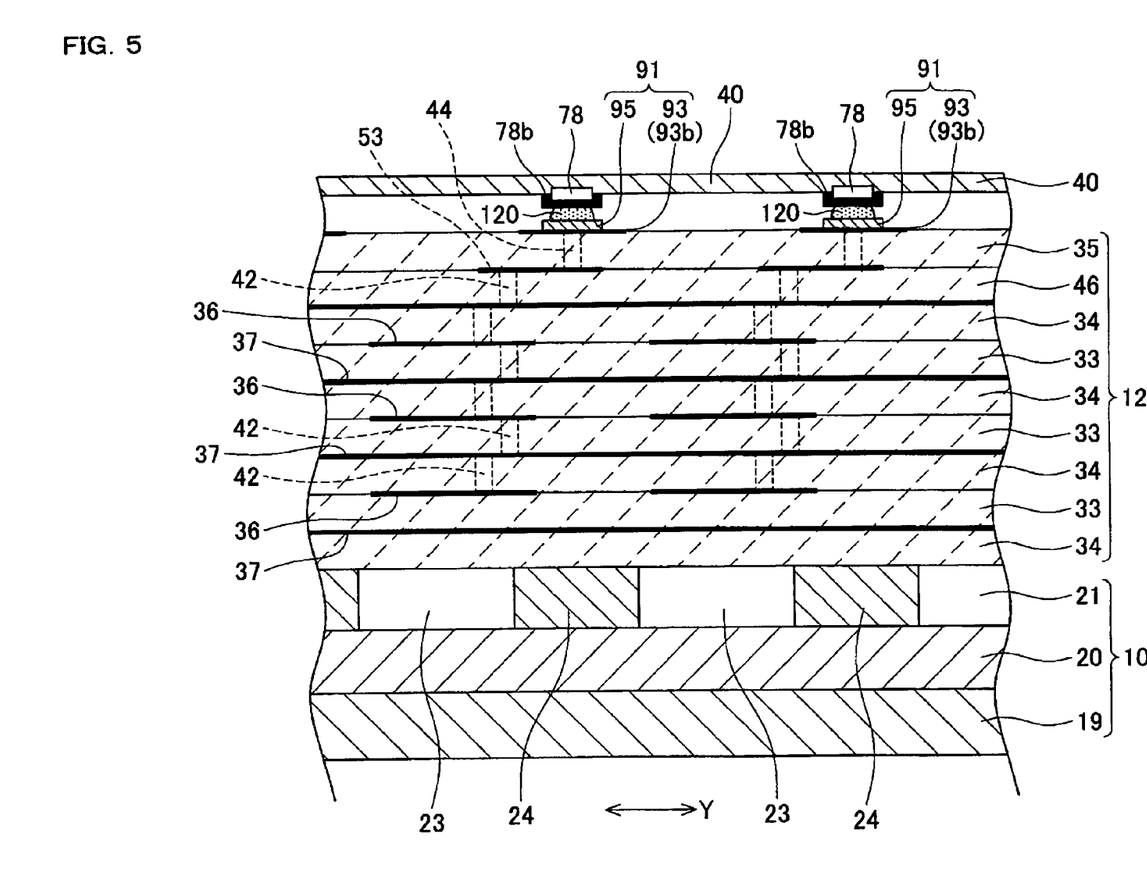
FIG. 5 is a partial enlarged sectional view of an FPC, the piezoelectric actuator, and the passage unit that are included in the ink-jet head shown in FIG. 1.

As shown in FIGS. 4 and 5, the piezoelectric actuator 12 includes a group of seven piezoelectric sheets 33 and 34, a restriction sheet 46 put on an upper face of the group, and a top sheet 35 put on an upper face of the restriction sheet 46. Each of the piezoelectric sheets 33 and 34 has a thickness of approximately 30 μm, and made of a piezoceramics plate. The restriction sheet 46 and the top sheet 35 may be made of piezoceramics or other materials, as long as they are electrically insulative.

A pattern of the individual electrodes 36 respectively corresponding to the pressure chambers 23 is screen-printed on upper faces of the respective piezoelectric sheets 33. Referring to FIG. 7B, as illustrated with alternate long and short dash lines, each of the individual electrodes 36 has a linear portion 36b of line shape and an end portion 36a which is an extension from the linear portion 36b toward an oblique direction. The linear portion 36b, which has a rectangular shape slightly smaller than a corresponding pressure chamber 23 (as illustrated with dotted lines in FIG. 7B), is positioned such that its outer edge is located within an outer edge of the corresponding pressure chamber 23. The end portion 36 a is located outside the corresponding pressure chamber 23 and does not overlap the pressure chamber 23 in a plan view.

In FIG. 4, the individual electrodes 36 are arranged in rows 36-1, 36-2, 36-3, 36-4, and 36-5, which correspond to the pressure chamber rows 23-1, 23-2, 23-3, 23-4, 23-5, respectively. Only in the third row 36-3, the individual electrodes 36 are arranged in such a manner that the end portion 36a extends from a corresponding linear portion 36b in an alternate direction.

As shown in FIGS. 4 and 7B, in a plan view, each of the end portions 36a overlaps a connecting individual electrode 38 formed on an upper-layered piezoelectric sheet 34 and a connecting individual electrode 53 formed on the restriction sheet 46. Also as shown in FIG. 7B, each of the end portions 36a is positioned so as to be electrically connectable to an inner conductive electrode 42 that is formed in a through hole extending through an upper-layered piezoelectric sheet 34.

As shown in FIG. 4, a connecting common electrode 43 is also screen-printed on the upper faces of the respective piezoelectric sheets 33. The connecting common electrode 43 is along an edge of the piezoelectric sheet 33.

A common electrode 37 is screen-printed on upper faces of the respective piezoelectric sheets 34. The lowermost piezoelectric sheet 34 has the common electrode 37 formed throughout its entire upper face.

As shown in FIG. 4, each of the common electrodes 37 formed on the other piezoelectric sheets 34 other than the lowermost one includes five first electrically-conductive portions 37a, and second electrically-conductive portions 37b. The five first electrically-conductive portions 37a extend along the longer side of the piezoelectric sheet 34, i.e., along the Y direction. The second electrically-conductive portions 37b extend along the shorter side of the piezoelectric sheet 34, i.e., along the X direction, and connect opposite ends of the first electrically-conductive portions 37a. In a plan view, the five first electrically-conductive portions 37a overlap the individual electrode rows 36-1 to 36-5, respectively.

Connecting individual electrodes 38 are also formed on the respective piezoelectric sheets 34 except the lowermost piezoelectric sheet 34. The connecting individual electrodes 38 form first island-like individual conductive portions. Each of the connecting individual electrodes 38 has a substantially rectangular shape and overlaps an end portion 36a of a corresponding individual electrode 36 in a plan view. Each row of the connecting individual electrode 38 is sandwiched between a neighboring pair of first electrically-conductive portions 37a.

Connecting individual electrodes 53, which respectively coincide with the connecting individual electrodes 38 in a plan view, and a connecting common electrode 54, which acts as a common conductive portion, are formed on the upper face of the restriction sheet 46. The connecting common electrode 54 is formed along the shorter side of the restriction sheet 46. In a plan view, the communicating common electrode 54 overlaps the second electrically-conductive portion 37b of the common electrode 37 and also overlaps a part of the connecting common electrode 43.

Through holes are formed in regions of the piezoelectric sheets 33 formed with the connecting common electrodes 43, in regions of the piezoelectric sheets 34, except the lowermost one, formed with the common electrodes 37, and in a region of the restriction sheet 46 formed with the communicating common electrode 54. Each of the through holes is filled with a conductive paste to form an inner conductive electrode (not shown), so that the common electrodes 37, the connecting common electrodes 43 and 54 which are aligned in the vertical direction are electrically connected.

In the same manner, through holes are formed in regions of the piezoelectric sheets 33 formed with the end portions 36a of the individual electrodes 36, in regions of the piezoelectric sheet 34 formed with the connecting individual electrodes 38, and in a region of the restriction sheet 46 formed with the connecting individual electrode 53. Each of the through holes is filled with a conductive paste to form an inner conductive electrode 42 (see FIG. 5), so that the individual electrodes 36, the connecting individual electrodes 38 and 53 which are aligned in the vertical direction are electrically connected with one another. The inner conductive electrodes 42 formed in the respective sheets 33, 34, and 46 are arranged at appropriate intervals so as not to overlap in a plan view (see FIG. 5 and FIG. 7B).

As shown in FIG. 4, on an upper face of the top sheet 35, external terminals 90 associated with the common electrodes and external terminals 91 associated with the individual electrodes are formed. The external terminals 90 are bonded to terminals 77 of the FPC 40, and the external terminals 91 are bonded to terminals 78 of the FPC 40. An external terminal 90 includes a thin surface electrode 92, and a thick bond terminal 94 that is formed on the surface electrode 92. An external terminal 91 includes a thin surface electrode 93, and a thick bond terminal 95 that is formed on the surface electrode 92 (see FIGS. 4, 5, and 6). The external terminals 90 extend like a belt along an outer edge of the top sheet 35, while the external terminals 91 are arranged at regular intervals and form groups. To be more specific, the external terminals 91 are arranged in a zigzag pattern while forming rows which extend along the Y direction and correspond to the pressure chamber rows 23-1 to 23-5, as shown in FIGS. 2 and 4.

As shown in FIG. 4, the surface electrode 92 of the external terminal 90 has a belt-like shape which overlaps the communicating common electrode 54 of the restriction sheet 46 in a plan view. The bond terminals 94 each having an appropriate shape are attached onto the surface electrode 92.

Figure 6:
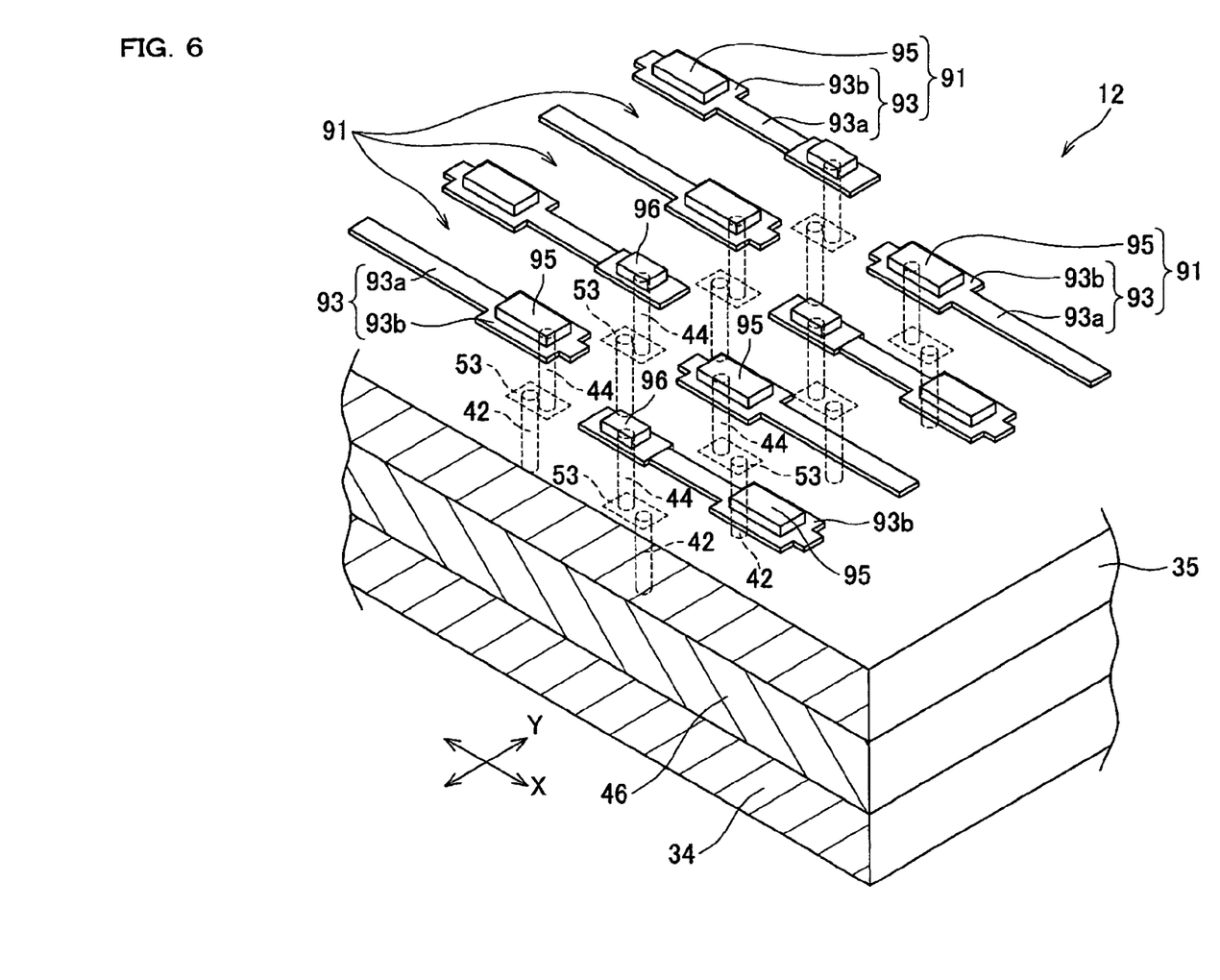
FIG. 6 is a partial perspective view showing external terminals formed on an upper face of the piezoelectric actuator.

As shown in FIG. 6, the surface electrode 93 of the external terminal 91 includes a narrow portion 93a and a wide portion 93b. The narrow portion 93a extends in the X direction, and the wide portion 93b is connected to the narrow portion 93a. The external terminals 91 are arranged in such a manner that, with respect to the Y direction, the wide portion 93b extends from a corresponding narrow portion 93a in an alternate direction. Therefore, even though the external terminals 91 include the wide portions 93b, they can be spaced apart enough from neighboring external terminals 91 with respect to the Y direction, thus suppressing an electrical short circuit caused by contact between the external terminals 91.

As shown in FIG. 7B, a width W2 of the narrow portion 93a is smaller than a width W1 of the partition 24 that defines the pressure chambers 23 (W2<W1). A width W3 of the wide portion 93b is slightly larger than the width W1 of the partition 24. In a plan view, each of the surface electrodes 93 partly overlaps a connecting individual electrode 53 of the restriction sheet 46.

As shown in FIGS. 5 and 7B, the surface electrodes 93 are respectively located above the partitions 24. That is, an arrangement of the surface electrodes 93 is shifted from the arrangement of the pressure chambers 23 by a half pitch, and an interval between the surface electrodes 93 is the same as the interval P0 between the pressure chambers 23 with respect to the Y direction. In this embodiment, the arrangement interval P0 is approximately 0.339 μm, the width W1 is approximately 120 to 150 μm, the width W2 is approximately 100 μm, the width W3 is approximately 150 to 300 μm and more preferably 200 to 220 μm, and a length L3 of the wide portion 93b is approximately 360 μm (see FIGS. 7A and 7B). A thickness of the surface electrode 93 is approximately 1 to 2 μm.

The bond terminal 95 attached to a surface of the wide portion 93b has an area smaller than that of the wide portion 93b, and is arranged so that an outer edge of the bond terminal 95 is located inside an outer edge of the wide portion 93b. In this embodiment, a width W4 of the bond terminal 95 is approximately 150 to 200 μm, and a distance W5 between the outer edge of the bond terminal 95 and the outer edge of the wide portion 93b is approximately 25 μm. A thickness of the bond terminal 95 is approximately 20 μm.

Through holes are formed in regions of the top sheet 35 formed with the external terminals 90 and 91. Each of the through holes is filled with a conductive paste to form an inner conductive electrode 44 (see FIGS. 5 and 6), so that the bond terminal 90 is electrically connected to the communicating common electrode 54 and that the respective bond terminals 91 are electrically connected to the connecting individual electrodes 53.

In order that upper portions of the inner conductive electrodes 44 which are in contact with the surface electrodes 92 and 93 do not be exposed on the piezoelectric actuator 12, filling electrodes 96 made of the same material as of the bond terminals 94 and 95 are provided on the upper portions of the inner conductive electrodes 44. Thereby, portion where the inner conductive electrodes 44 are connected to the surface electrodes 92 and 93 are protected.

Figure 7A:
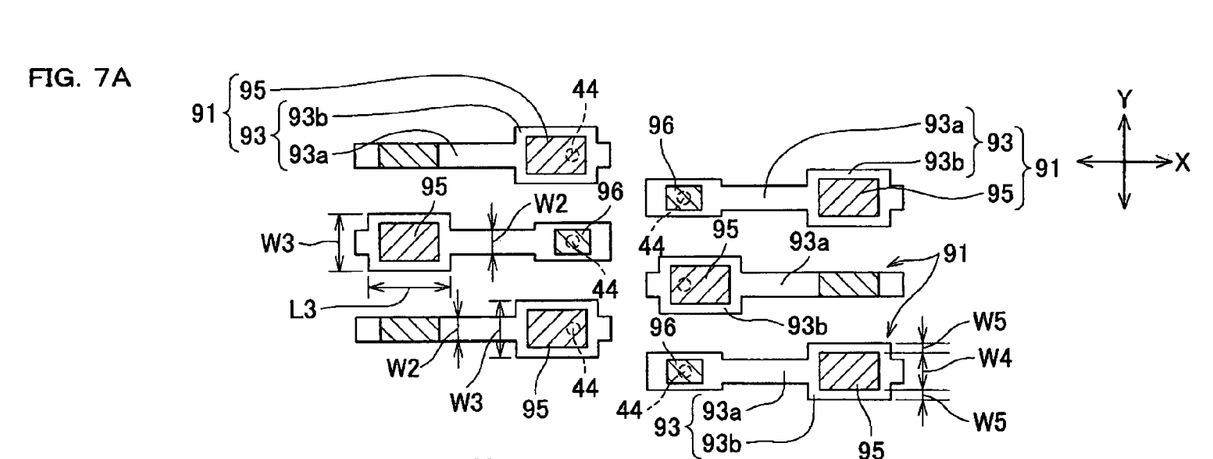
FIG. 7A is a plan view showing a positional relationship of the external terminals.
Figure 7B:
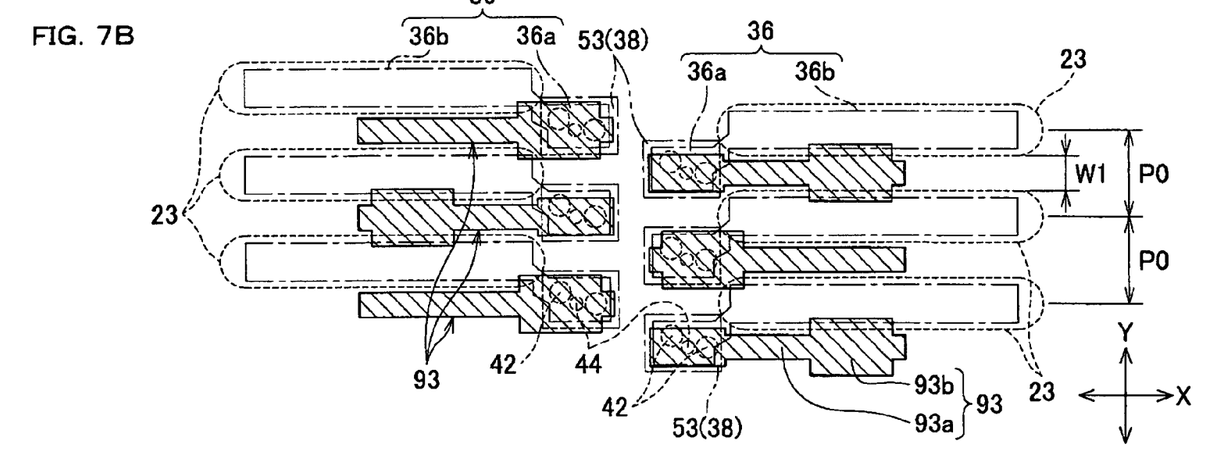
FIG. 7B is a plan view showing a positional relationship between the external terminals and pressure chambers, etc.

As shown in FIGS. 6 and 7A, the inner conductive electrodes 44 corresponding to the respective surface electrodes 93 are arranged along the Y direction, and protected alternatingly by the bond terminal 95 and by the filling electrode 96 with respect to the Y direction. That is, the bond terminals 95, which are included in the respective external terminals 91 arranged in the Y direction, alternately serve as the filling electrode 96, too.

Shapes of the filling terminals 96 and the bond terminals 94, 95 may be not only rectangle but also other appropriate shapes such as an oval, an ellipse, and the like.

To make the piezoelectric actuator 12, the laminated piezoelectric sheets 33 and 34, each of which has the surface electrodes 92, 93, electrodes 36, 37, or the like formed thereon, are sintered to be integrated with each other. Then, the bond terminals 94 and 95 are respectively attached onto the surface electrodes 92 and 93 by means of a printing or plating. The surface electrodes 92 and 93, which change in their properties in the sintering step, cannot be properly bonded to later-described conductive adhesive 120. However, in this embodiment, the bond terminals 94 and 95 formed after the sintering step are bonded to the conductive adhesive 120, thereby resolving the above bonding problem.

Next, a construction of the FPC 40 will be described with reference to FIGS. 8A and 8B. As shown in FIG. 1, the FPC 40 has it one end put on the piezoelectric actuator 12 and extends outward in the X direction.

Figure 8A:
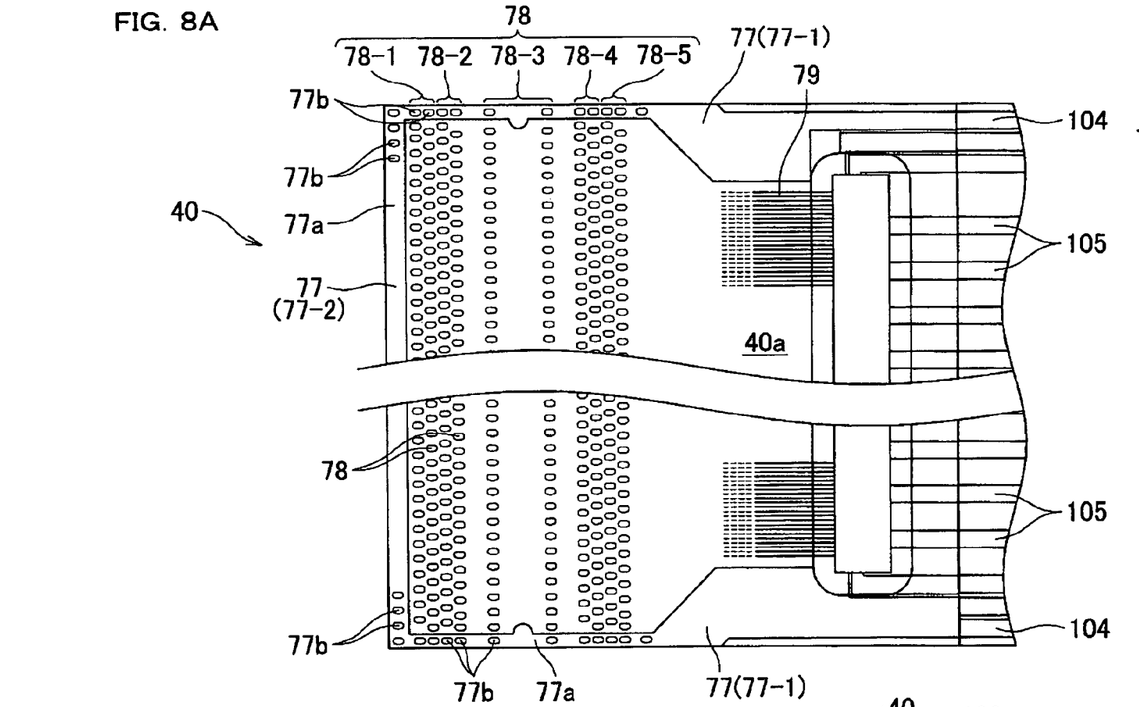
FIG. 8A is a plan view showing terminals, wirings, an integrated circuit, and the like which are provided on the FPC.
Figure 8B:
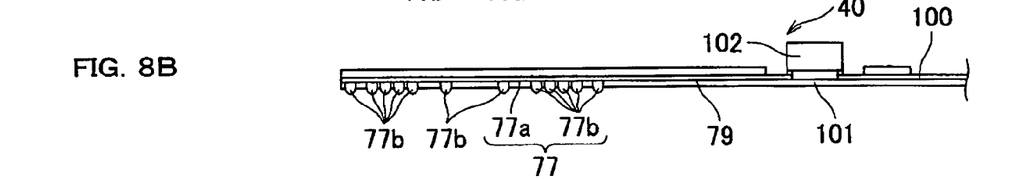
FIG. 8B is a side-view of FIG. 8A.

As shown in FIGS. 8A and 8B, the FPC 40 has a band-like base 100 that are elongated in the X direction and made of an electrically-insulative, flexible synthetic resin material, e.g., a polyimide resin, a polyester resin, and a polyamide resin. On a lower face of the base 100, the terminals 77 associated with the common electrodes, the terminals 78 associated with the individual electrodes, micro wirings 79, and terminals 104 and 105 are formed by a process using photoresist or the like. A surface of the base 100 is covered with a cover lay 101 with portions corresponding to the terminals 78 and later-described terminals 77b uncovered. The cover lay 101 is made of an electrically-insulative, flexible synthetic resin material, e.g., a polyimide resin, a polyester resin, and a polyamide resin.

The terminal 77 includes a thin electrode 77a and thick bond terminals 77b. The bond terminals 77b are formed on the electrode 77a. The electrode 77a corresponds to the surface electrode 92 of the external terminal 90 that is provided on the upper face of the piezoelectric actuator 12, and the bond terminals 77b respectively correspond to the bond terminals 94 of the external terminal 90. The terminal 77 is formed along an outer edge of the FPC 40, and includes a pair of first terminals 77-1 that extend in the X direction and a second terminal 77-2 that extends in the Y direction. Opposite ends of the second terminal 77-2 are connected to one ends of the respective first terminals 77-1. The other ends of the respective first terminals 77-1 are connected to terminals 104.

The terminals 78 respectively confront the bond terminals 95 of the external terminals 91 shown in FIGS. 2 and 4, and are arranged in a zigzag pattern while forming row-groups (denoted by 78-1, 78-2, 78-3, 78-4, and 78-5 in FIG. 8A) which extend along the Y direction and correspond to the pressure chamber rows 23-1 to 23-5, respectively. Each of the row-groups 78-1, 78-2, 78-3, 78-4, and 78-5 includes two rows of terminals 78.

A diver IC 102 is mounted on the FPC 40. The number of wirings 79 that extend in the X direction is the same as that of the nozzles 11a or pressure chambers 23. Each of the wirings 79 has its one end connected to a corresponding terminal 78 and the other end connected to the diver IC 102. Thus, the terminals 78 are electrically connected to respective terminals of the driver IC 102 via the wirings 79. The driver IC 102 converts recording data that are serial-transferred from an external equipment, e.g., a control board of a main body of a recording apparatus including a head 1, into parallel data that correspond to the respective nozzles 11a. Then, the driver IC 102 generates waveform signals of predetermined voltage corresponding to the recording data, and outputs the waveform signals to the respective wirings 79. The wirings 79 transmit the waveform signals to the terminals 78, respectively.

In a region of the base 100 that is closer to the external equipment than the driver IC, many terminals 105 are arranged along the X direction, and also terminals 104 are provided on both sides of a group of the many terminals 105. The terminals 104 are electrically connected to the terminal 77, and the terminals 105 are electrically connected to the driver IC 102. In order to connect the piezoelectric actuator 12 to the driver IC 102, the wirings 79 must be formed at a high density such that the number of the wirings 79 is the same as the number of nozzles as shown in FIG. 8A. Meanwhile, in the region closer to the external equipment than the driver IC, since serial data are transferred from the external equipment to the driver IC 102, the terminals 105 are formed at a low density.

Figure 9:
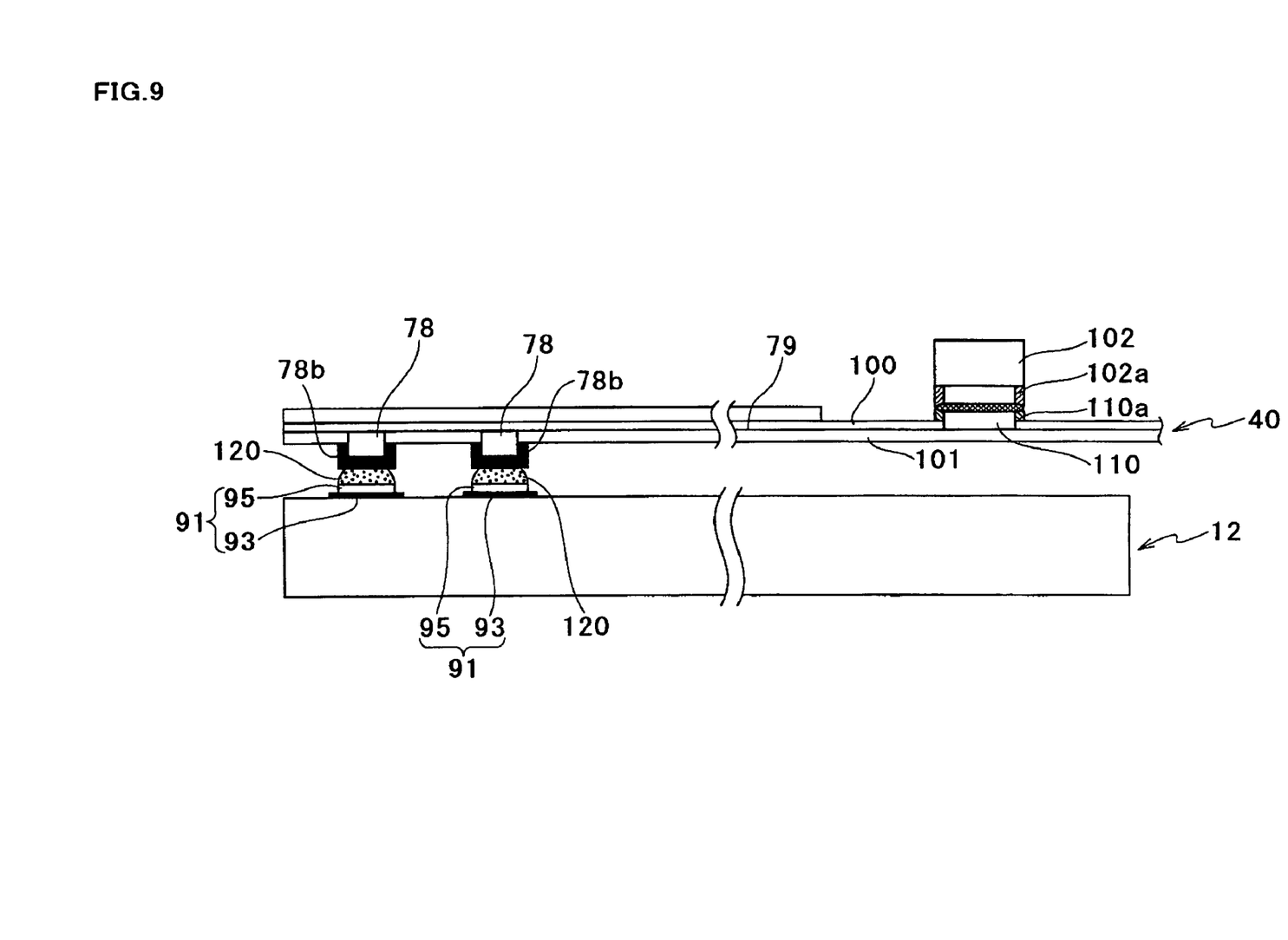
FIG. 9 schematically illustrates portions where the FPC is bonded to the piezoelectric actuator.

As shown in FIG. 9, the terminals 78 associated with the individual electrodes and terminals 110 (only one is shown in FIG. 9) for connecting the FPC 40 to the driver IC 102 are also provided on the FPC 40. A tin-plated layer 110a formed on a surface of each of the terminals 110 and a corresponding one of gold electrodes 102a provided on the driver IC 102 are connected by means of gold-tin eutectic bonding, so that the driver IC 102 is mounted on the FPC 40.

The terminals 77, 78, and 110 provided on the FPC 40 are made of copper.

Next, a portion where the FPC 40 is bonded to the piezoelectric actuator 12 is described in detail with reference to FIG. 9. In the following, a description will be given only to a bonding between the terminal 78 of the FPC 40 associated with the individual electrode and the external terminal 91 of the piezoelectric actuator 12. The same description can also apply to a bonding between the terminal 77 of the FPC 40 associated with the common electrode and the external terminal 90 of the piezoelectric actuator 12, and therefore its description will be omitted.

A copper-tin alloy layer 78b is formed on a surface of the terminal 78. With a thermo-setting conductive adhesive 120, this copper-tin alloy layer 78b is bonded to the bond terminal 95 of the external terminal 91 formed on the piezoelectric actuator 12. In this embodiment, the conductive adhesive 120 is made of an epoxy-based resin including silver powder.

The conductive adhesive 120 contains an additive, a diluent, a curing agent, a resin, and a filler. The additive includes a dispersing agent and a coupling agent. The dispersing agent serves to improve dispersibility of the filler and to prevent aggregation of the filler. The coupling agent serves to improve adhesive properties and film physical properties. The diluent includes a reactive diluent and a nonreactive diluent. The reactive diluent serves to control viscosity, to thereby affect curing properties and adhesive properties. The nonreactive diluent serves to control viscosity, and vaporizes in a curing process. The curing agent includes a latent curing agent and an accelerating agent. The latent curing agent is a single-liquid type and serves to cure the resin. The accelerating agent serves to accelerate a curing reaction so as to shorten a time for curing. The resin includes an epoxy resin that serves as a base of a binder.

Next, a method for manufacturing the inkjet head 1 will be described with reference to FIGS. 10 and 11. A bonding between the terminal 77 of the FPC 40 associated with the common electrode and the external terminal 90 of the piezoelectric actuator 12 is not illustrated herein, because it is similar to a bonding between the terminal 78 of the FPC 40 associated with the individual electrode and the external terminal 91 of the piezoelectric actuator 12 which is shown in FIG. 11.

Figure 10:
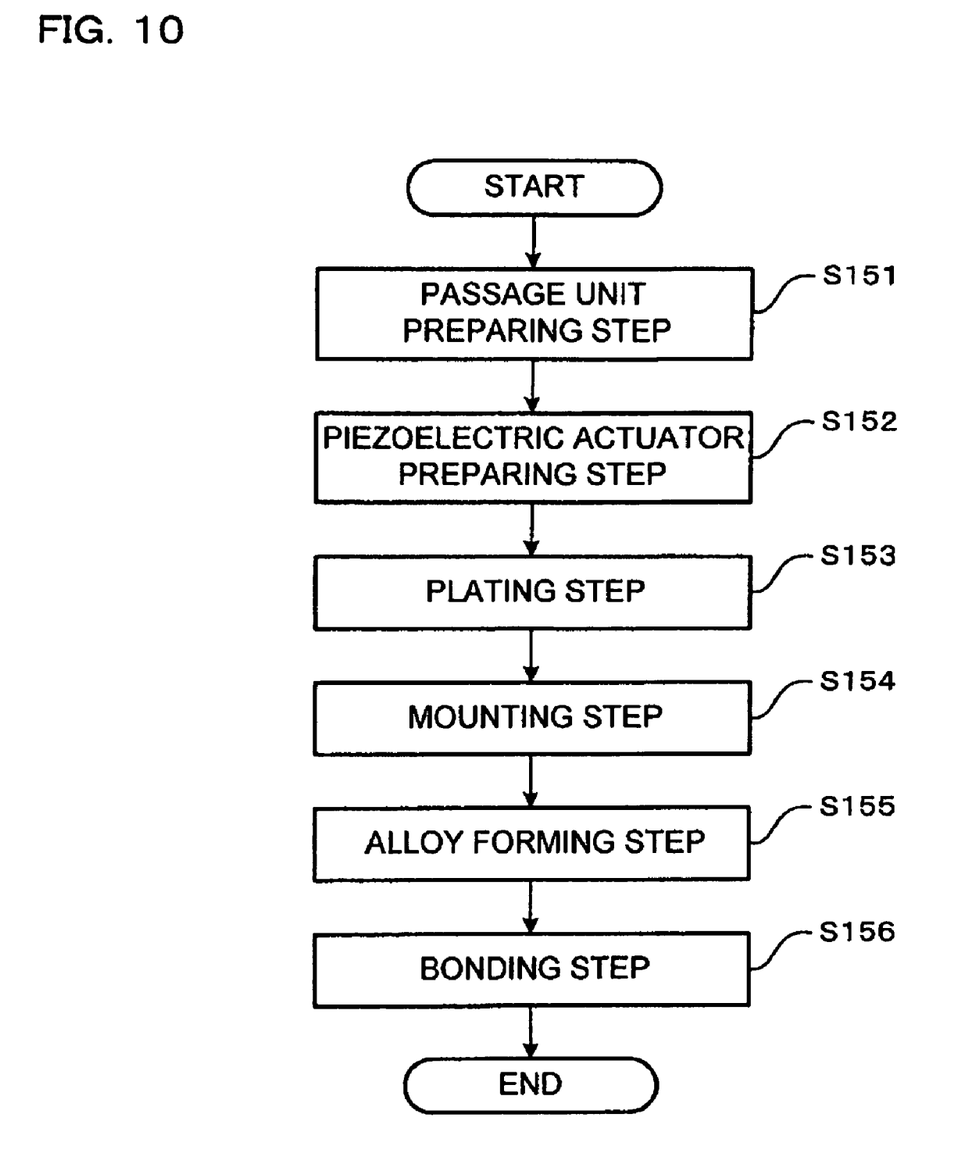
FIG. 10 is a flow chart showing a process of manufacturing the ink-jet head.
Figure 11:
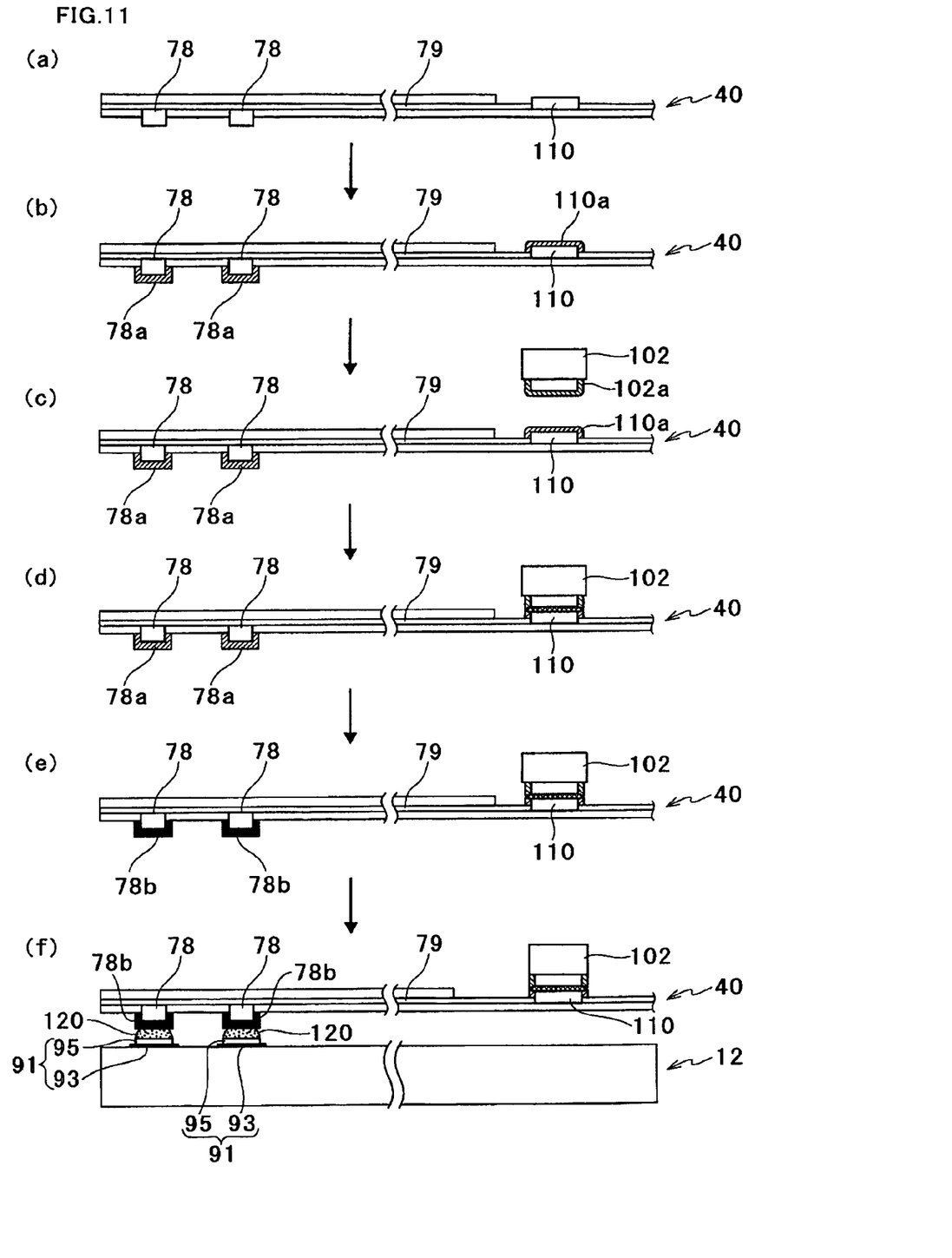
FIG. 11 shows respective steps involved in the processing of manufacturing the ink-jet head.

As shown in FIG. 10, manufacturing of the ink-jet head 1 involves a passage unit preparing step S151, a piezoelectric actuator preparing step S152, a plating step S153, a mounting step S154, an alloy forming step S155, and a bonding step S156.

In the passage unit preparing step S151, plates 11, 15 to 21 are positioned with one another so as to form many ink passages corresponding to the respective nozzles 11a and each extending from an ink supply port 31 through a common ink chamber 26 and a pressure chamber 23 to a nozzle 11a. The plates 11, 15 to 21 thus positioned are put in layers and bonded to one another with an adhesive.

In the piezoelectric actuator preparing step S152, the four piezoelectric sheets 34 are prepared by screen-printing patterns of the common electrodes 37, while the three piezoelectric sheets 33 are prepared by screen-printing patterns of the individual electrodes 36 that correspond to the respective pressure chambers 23. The three piezoelectric sheets 33 and the four piezoelectric sheets 34 are alternately layered on one another. Then, the restriction sheet 46 having the connecting individual electrode 53 is put on an upper face of the layered piezoelectric sheets 33 and 34, and furthermore, the top sheet 35 having the external terminals 90 and 91 is put on an upper face of the restriction sheet 46. All of these sheets thus put in layers are bonded to one another.

In the plating step S153, the terminals 77, 78, and the terminals 110 for connecting the FPC 40 to the driver IC 102, which are formed on the FPC 40, are electroplated with tin. A tin-plated layer is thereby formed on surfaces of the terminals 77, 78, and 110. Referring to FIG. 11, a second view shows tin-plated layers 78a and 110a that are formed on the surface of the terminals 78 and 110, respectively.

In the mounting step S154, as shown in third and fourth views of FIG. 11, each of the gold electrodes 102a of the driver IC 102 is bonded to a corresponding terminal 110 of the FPC 40 via the tin-plated layer 110a formed on the surface of the terminal 110 by means of gold-tin eutectic bonding, to thereby mount the driver IC 102 on the FPC 40. The gold-tin eutectic bonding is performed at a heating temperature of approximately 270 to 300 degrees C. and under pressure of approximately 10 to 30 gf per terminal 110.

In the alloy forming step S155, the FPC 40 is heated at approximately 180 degrees C. for about 10 minutes. Thereby, tin ions that exists in the tin-plated layer formed on the surface of the terminals 77 and 78 are scattered over copper that forms the terminals 77 and 78, so that the tin-plated layer changes into a copper-tin alloy. Therefore, copper-tin alloy layers are formed on the surfaces of the terminals 77 and 78. The fifth view of FIG. 11 shows copper-tin alloy layers 78b formed on the surfaces of the terminals 78.

In the bonding step S156, a thermosetting conductive adhesive 120 is placed on the bond terminals 94 and 95 of the external terminals 90 and 91 that are formed on the piezoelectric actuator 12. Then, under a temperature of approximately 150 degrees C., the bond terminals 94 and 95 are bonded through the conductive adhesive 120 to the copper-tin alloy layers formed on the surfaces of the terminals 77 and 78, respectively (see the lowermost view of FIG. 11).

Here, with reference to TABLE 1 and FIG. 12, a description will be given to how an electrical resistance between the terminals 77, 78 of the FPC 40 and the bond terminals 94, 95 of the piezoelectric actuator 12 changes when, as in this embodiment, copper-tin alloy layers are formed on surfaces of the terminals 77, 78 by a heat treatment and then bonded through the thermosetting conductive adhesive 120 to bond terminals 94, 95 formed on the piezoelectric actuator 12.

TABLE 1

| | TIME ELAPSED(hour) | | | | |
| --- | --- | --- | --- | --- | --- |
| | 0 | 100 | 200 | 500 | 1000 |
| Au | 20 | 20 | 20 | 21 | 21 |
| Sn(UNSCATTERED) | 20 | 60 | 150 | 700 | 2000 |
| Sn(SCATTERED) | 20 | 30 | 40 | 60 | 60 |

(mΩ)

TABLE 1 shows results of evaluation tests for electrical contact resistance between the terminals 77, 78 of the FPC 40 and the bond terminals 94, 95 of the piezoelectric actuator 12. FIG. 12 is a graph showing these results. A high-temperature high-humidity preservation test was applied, in which an electrical contact resistance value was measured at different points in an elapsed time. TABLE 1 and FIG. 12 shows not only a case of "Sn (scattered)" corresponding to the embodiment, but also cases of "Sn (unscattered)" and "Au" as comparative examples. The case of "Sn (unscattered)" means a case where tin-plated layers formed on the surfaces of the terminals 77, 78 were bonded through a thermosetting conductive adhesive to the bond terminals 94, 95 of the piezoelectric actuator 12. The case of "Au" means a case where gold-plated layers formed on the surfaces of the terminals 77, 78 were bonded through a thermosetting conductive adhesive to the bond terminals 94, 95 of the piezoelectric actuator 12.

Figure 12:
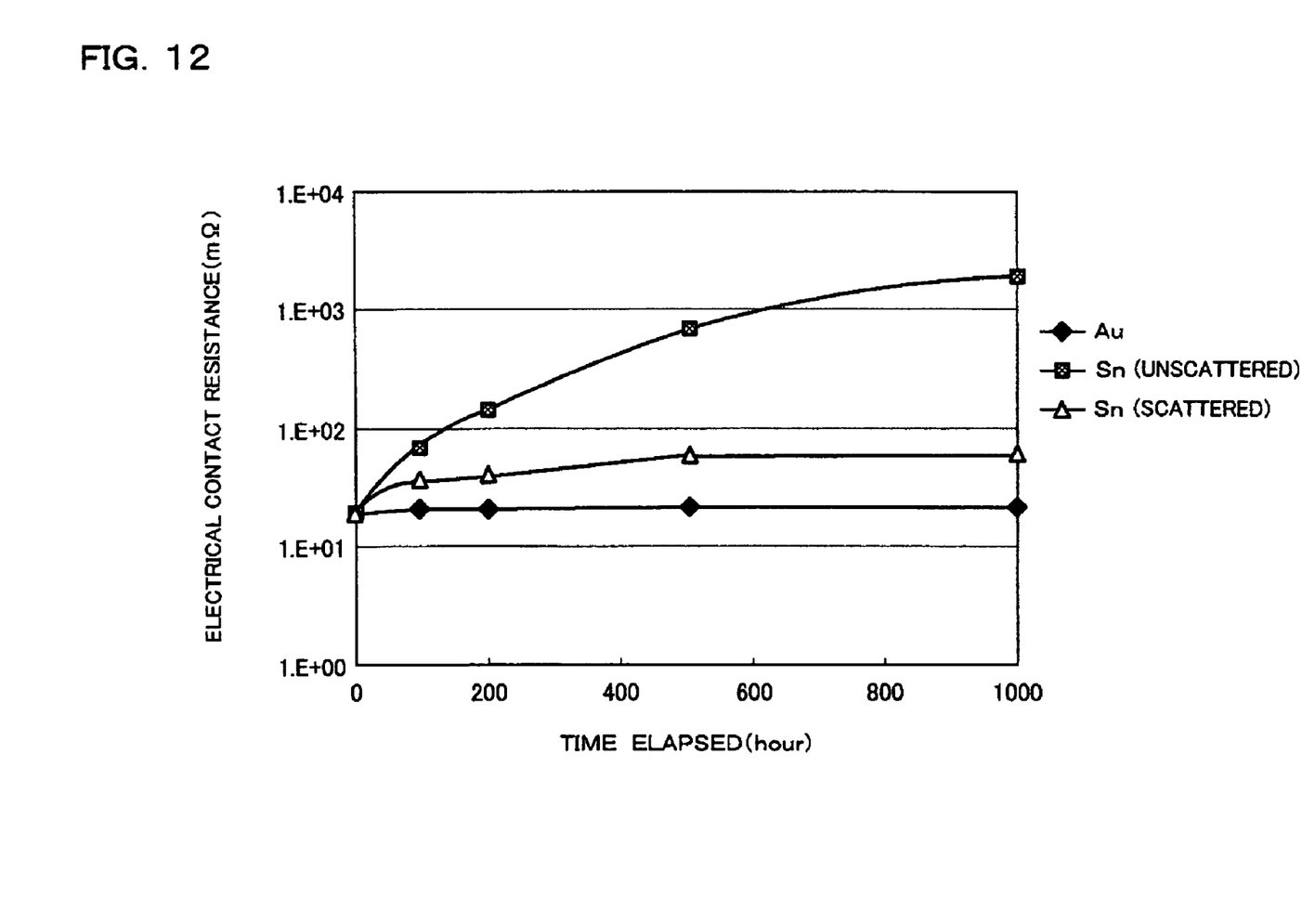
FIG. 12 is a graph showing results of evaluation tests for electrical contact resistance.

As seen from TABLE 1 and FIG. 12, the electrical contact resistance was substantially constant even after 1,000 hours, in the case of "Sn (scattered)" in which copper-tin alloy layers formed on the surfaces of the terminals 77, 78 were bonded through a thermosetting conductive adhesive to the bond terminals 94, 95 of the piezoelectric actuator 12 and in the case of "Au" in which gold-plated layers formed on the surfaces of the terminals 77, 78 were bonded through a thermosetting conductive adhesive to the bond terminals 94, 95 of the piezoelectric actuator 12.

When, as in this embodiment, tin-plated layers formed on the surfaces of the terminals 77, 78 were bonded through a thermosetting conductive adhesive to the bond terminals 94, 95 of the piezoelectric actuator 12 ("Sn (scattered)"), the electrical contact resistance a little bit increased over time, but a degree of increase thereof was significantly lower than in the case of "Sn (unscattered)".

In the ink-jet head 1 of this embodiment, as thus has been described above, heating of the FPC 40 causes copper and tin to be scattered in the surfaces of the copper-made terminals 77 and 78, to form copper-tin alloy layers on the surfaces of the terminals 77 and 78. This can relieve a problem that tin ions existing in the tin-plated layers formed on the surfaces of the terminals 77 and 78 are scattered over the conductive adhesive 120 to thereby increase the electrical contact resistance between the terminals 77, 78 of the FPC 40 and the bond terminals 94, 95 of the piezoelectric actuator 12, though this problem may occur if the tin-plated layers formed on the surfaces of the terminals 77 and 78 are bonded through a thermosetting conductive adhesive to the bond terminals 94, 95 of the piezoelectric actuator 12 (as indicated by "Sn (unscattered)" in TABLE 1 and FIG. 12). That is, as indicated by "Sn (scattered)" in TABLE 1 and FIG. 12, the electrical contact resistance between the terminals 77, 78 of the FPC 40 and the bond terminals 94 and 95 of the piezoelectric actuator 12 becomes lower.

In the plating step S153, there is no need to cover the terminals 77 and 78 against the tin plate. Thus, complicated procedures including a step of covering the terminals 77 and 78 and a step of removing the covering are not required, to prevent increase of a manufacturing cost.

In this embodiment, the thermosetting conductive adhesive 120 is made of an epoxy-based resin including silver powder, and is cured at a relatively low temperature. Accordingly, heat-affect on an electronic component such as the driver IC 102 becomes smaller, and the electronic component can hardly break down. In addition, silver powder is more reasonable than gold powder or platinum powder which also is applicable to a conductive adhesive, and therefore the conductive adhesive can be prepared at a lower cost.

The terminals 77 and 78 are formed on the lower face of the FPC 40 which confronts the piezoelectric actuator 12, while the terminals 110 for connecting the FPC 40 to the driver IC 102 are formed on the upper face of the FPC 40 which is opposite to the lower face confronting the piezoelectric actuator 12. Therefore, a portion of the FPC 40 to which the driver IC 102 has been bonded in the mounting step S154 can be restrained from being heat-affected in the alloy forming step S155.

When, without forming the copper-tin alloy layers on the surfaces of the terminals 77 and 78, the tin-plated layers formed on the surfaces of the terminals 77 and 78 are bonded through a thermosetting conductive adhesive to the bond terminals 94 and 95 of the piezoelectric actuator 12 (in the case of "Sn (unscattered)"), tin ions existing in the tin-plated layers formed on the surface of the terminals 77 and 78 are scattered over the conductive adhesive 120, with the result that many voids are generated within the tin-plated layers. These voids deteriorate strength of the tin-plated layer, and the conductive adhesive 120 becomes easily separated from the terminals 77 and 78. In this embodiment, however, the copper-tin alloy layers are formed on the surfaces of the terminals 77 and 78, so that the tin ions existing in the copper-tin alloy layers are not easily scattered over the conductive adhesive 120. Consequently, generation of voids in the surfaces of the terminals 77 and 78 is suppressed, and accordingly the surfaces of the terminals 77 and 78 become solid. Thus, the conductive adhesive 120 is not easily separated from the terminals 77 and 78. In this embodiment, therefore, the terminals 77 and 78 of the FPC 40 are bonded to the bond terminals 94 and 95 of the piezoelectric actuator 12 with improved bond strength as compare with the case of "Sn (unscattered)".

In the above-described embodiment, the terminals 77 and 78 are formed on the lower face of the FPC 40, while the terminals 110 for connecting the FPC 40 to the driver IC 102 are formed on the upper face of the FPC 40. However, the terminals 77 and 78, and the terminals 110 may be formed on the same face.

The thermosetting conductive adhesive 120 is not limited to one made of an epoxy-based resin including silver powder, but may be various kinds of adhesives.

The terminals 110 formed on the FPC 40 in order to connect the FPC 40 to the driver IC 102 may be made of materials other than copper, such as gold, silver, and the like.

The ink-jet head 1 and the method for manufacturing the ink-jet head 1 have been described in the above embodiment. However, the present invention may be applied to, other than the ink-jet head 1, a board assembly that includes a circuit board, an electronic component mounted on the circuit board, and another board bonded to the circuit board, and to a method for manufacturing the board assembly. The board assembly and the manufacturing method thereof having the same construction as described in the above embodiment can also present the same effect as of the above embodiment. Here, the another board included in the board assembly means one having a terminal for electrically connecting to the circuit board, and exemplified nonlimitatively by the piezoelectric actuator 12 of the above embodiment having the bond terminals 94 and 95 for electrically connecting to the terminals 77 and 78 of the FPC 40.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A method for manufacturing a board assembly comprising the steps of:
    tin-plating a first terminal and a copper-made second terminal that are formed on a circuit board;
    mounting an electronic component on the circuit board by means of gold-tin eutectic bonding between a gold electrode of the electronic component and the tin-plated first terminal;
    forming a copper-tin alloy on a surface of the second terminal by heating the circuit board after the mounting step; and
    bonding the second terminal having the copper-tin alloy formed on the surface of the second terminal to another terminal of another board by means of a thermosetting conductive adhesive.

2. The method according to claim 1, wherein the conductive adhesive is made of an epoxy-based resin including silver powder.

3. The method according to claim 1, wherein the first terminal is formed on one face of the circuit board while the second terminal is formed on a face of the circuit board opposite to the one face.

4. A method for manufacturing an ink-jet head including a passage unit in which nozzles for ejecting ink and pressure chambers respectively communicating with the nozzles are formed, a piezoelectric actuator that changes a volume of any of the pressure chambers, a circuit board that is fixed to the piezoelectric actuator, and a driver IC that supplies a drive signal to the piezoelectric actuator,
    the method comprising the steps of:
    tin-plating a first terminal and a copper-made second terminal that are formed on the circuit board;
    mounting the driver IC on the circuit board by means of gold-tin eutectic bonding between a gold electrode of the driver IC and the tin-plated first terminal;
    forming a copper-tin alloy on a surface of the second terminal by heating the circuit board after the mounting step; and
    bonding the second terminal having the copper-tin alloy formed on the surface of the second terminal to another terminal of the piezoelectric actuator by means of a thermosetting conductive adhesive.

* * * * *